United States Patent [19]

Ackley

[11] Patent Number: 4,641,311

[45] Date of Patent: Feb. 3, 1987

[54] PHASE-LOCKED SEMICONDUCTOR LASER ARRAY WITH INTEGRAL PHASE SHIFTERS

[75] Inventor: Donald E. Ackley, West Amwell Township, Hunterdon County, N.J.

[73] Assignee: RCA Corporation, Princeton, N.J.

[21] Appl. No.: 563,605

[22] Filed: Dec. 20, 1983

[51] Int. Cl.$^4$ .............................................. H01S 3/098
[52] U.S. Cl. ........................................ 372/18; 372/48
[58] Field of Search ...................... 372/18, 27, 29, 45, 372/48

[56] References Cited

U.S. PATENT DOCUMENTS

| | | | |
|---|---|---|---|
| 3,701,047 | 10/1972 | Caplan et al. | 331/94.5 |
| 3,753,801 | 8/1973 | Lockwood et al. | 148/171 |
| 4,092,659 | 5/1978 | Ettenberg | 357/18 |
| 4,178,564 | 12/1979 | Ladany et al. | 331/94.5 |
| 4,217,561 | 8/1980 | Scifres et al. | 374/45 |
| 4,255,717 | 3/1981 | Scifres et al. | 331/94.5 |
| 4,347,486 | 8/1982 | Botez | 372/46 |
| 4,569,054 | 2/1986 | Connolly et al. | 372/45 |

OTHER PUBLICATIONS

Ackley; "Single Longitudinal Mode Operaton of High Power Multiple-Stripe Injection Lasers"; Appl. Phys. Lett.; vol. 42, No. 2; Jan. 15, 1983; pp. 152–154.

Ashley et al.; "Fresnel Lens in a Thin Film Waveguide"; Appl. Phys. Lett.; vol. 33, No. 6; Sep. 15, 1978; pp. 490–492.

D. Botez, IEEE Journal of Quantum Electronics QE17, 178 (1982).

J. Katz et al., Applied Physics Letters 42, 554 (1983).

*Primary Examiner*—William L. Sikes
*Assistant Examiner*—Robert E. Wise
*Attorney, Agent, or Firm*—B. E. Morris; W. J. Burke

[57] ABSTRACT

A phase-locked semiconductor laser array includes a plurality of channels in a surface of a substrate with lands therebetween with laser oscillation occurring in the cavity region over each of the channels. The individual oscillators are coupled by the overlap of their evanescent fields to produce a phase-locked array. Phase-shifting means are included in alternate channels to ensure that the laser light emitted by the different lasing regions are in phase with one another. Preferably the phase-shifting means comprise portions of each of alternate channels having a different spacing from the cavity region than that of the remainder of the channels.

9 Claims, 7 Drawing Figures

PHASE-LOCKED SEMICONDUCTOR LASER ARRAY WITH INTEGRAL PHASE SHIFTERS

The invention relates to a monolithic array of phase-locked semiconductor lasers having integral phase shifters to ensure that the elements of the array oscillate substantially in phase with one another.

BACKGROUND OF THE INVENTION

A semiconductor injection laser typically comprises a body of semiconductor material having a thin active layer between cladding regions of opposite conductivity type. To increase the output power, a guide layer having a refractive index which is intermediate between that of the active and cladding layers may be interposed between one of the cladding regions and the active region. Light generated in the active layer propagates in both the active and guide layers thereby forming a larger beam at the emitting facet of the body. The cavity region comprising an active layer or the combination of a guide layer and an active layer restricts oscillation in the transverse direction, the direction perpendicular to the plane of the layers, to the fundamental optical mode. In the lateral direction, the direction in the plane of the layers and perpendicular to the axis of light propagation, it has been found useful to introduce structural variations which produce an optical waveguide which in turn restricts the oscillation to the fundamental optical mode. Lasers incorporating transverse and lateral waveguides, such as that disclosed by Botez in U.S. Pat. No. 4,347,486, incorporated herein by reference, may have output powers in excess of about 40 milliwatts in the fundamental lateral and transverse mode.

To increase the output power in the laser beam beyond the capability of such an individual laser, monolithic arrays of spaced-apart laser devices, such as that disclosed by Botez et al. in U.S. Pat. No. 4,547,396, incorporated herein by reference, have been fabricated wherein the modes of oscillation of the individual lasers are coupled to one another to form a single phase-locked coupled oscillator. Such arrays that operate in a single longitudinal mode to output powers as high as 80 milliwatts have been observed. However, a problem with the typical phase-locked array is that nearly all of the devices have operated in such a manner that the far-field radiation pattern in the lateral direction has consisted of two lobes symmetrically located about the normal to the emitting surface of the array. This far-field distribution results because of gain considerations that cause adjacent devices to operate such that their relative phase is 180°. This far-field pattern is undesirable from a systems viewpoint because it requires excessively large optics to collimate the emitted beam. It would be desirable to have a phase-locked semiconductor laser array operating in the single transverse and lateral mode and having a far-field radiation pattern comprising a single lobe oriented perpendicular to the emitting surface of the laser.

SUMMARY OF THE INVENTION

A phase-locked laser array comprises a body of semiconductor material having a pair of reflecting surfaces. The body includes a substrate having a plurality of substantially parallel channels extending a distance into a first major surface thereof. A first cladding layer, a cavity region and a second cladding layer sequentially overlie the first major surface of the substrate and the channels. Alternate channels contain phase-shifting means for shifting the phase of laser beams propagating in the cavity region over said alternate channels relative to the phase of laser beams propagating over the adjacent channels. The phase-shifting means are preferably located so as to provide a substantially in-phase oscillation at least at the reflecting surface through which light is emitted from the body. Since the oscillations at the emitting surface of the body have substantially the same phase, the output from the array will be composed of a single, predominant lobe.

DETAILED DESCRIPTION OF PREFERRED EMBODIMENT

In the different FIGURES the same elements of the laser array of the invention have the same numerical identification.

Figure 1:
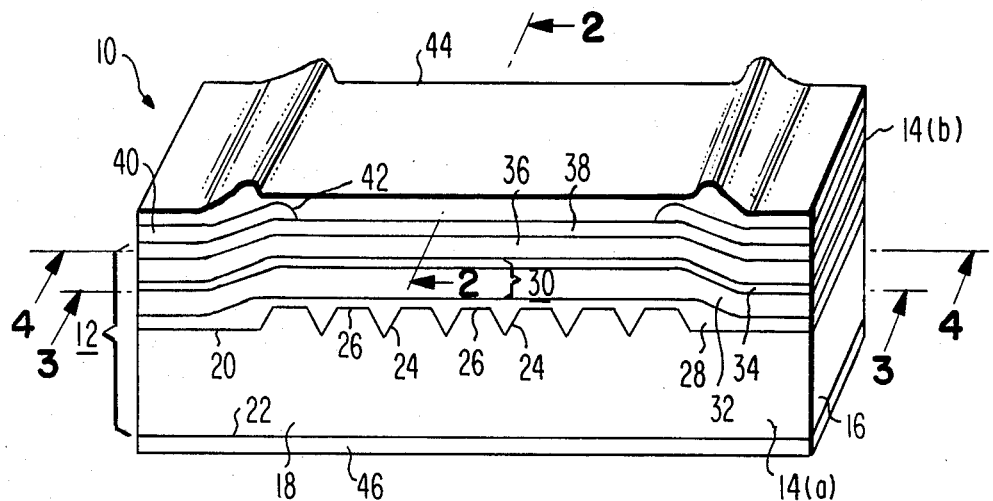
FIG. 1 is a perspective view of a phase-locked array of the invention.
Figure 2:
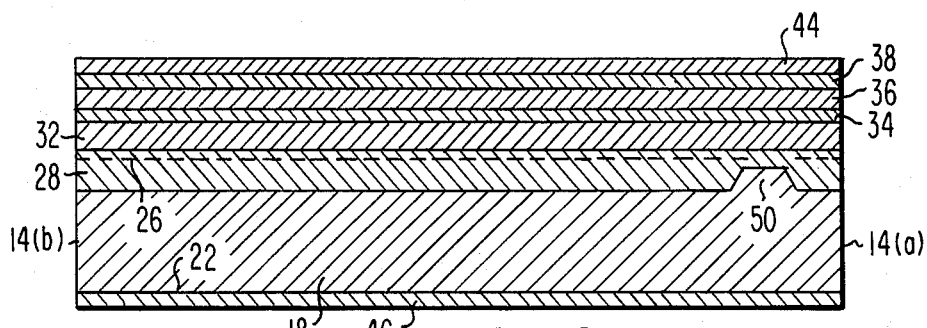
FIGS. 2, 3 and 4 are cross-sectional views along the lines 2—2, 3—3 and 4—4 of the phase-locked array of FIG. 1, respectively.
Figure 3:
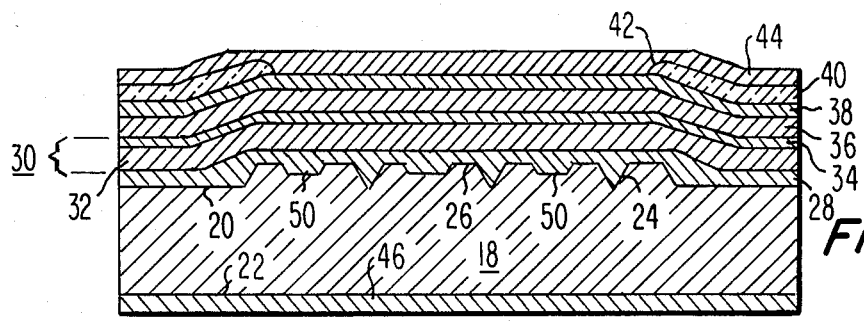

In FIGS. 1–3 a laser array 10 incorporating the invention comprises a body 12 of single crystalline semiconductor material having spaced, parallel reflecting surfaces 14(a) and (b) with the reflecting surface 14(a) being partially transparent so that laser light may be emitted therefrom. The body 12 also includes spaced, substantially parallel side surfaces 16 which extend between and are perpendicular to the reflecting surfaces 14(a) and (b).

The semiconductor body 12 includes a substrate 18 having first and second major surfaces 20 and 22, respectively, which extend between and are perpendicular to both the reflecting surfaces 14(a) and (b) and the side surfaces 16. The first major surface 20 includes a mesa with a plurality of spaced, substantially parallel channels 24 with lands 26 therebetween extending a distance into the surface 20. A first cladding layer 28 overlies the surfaces of the substrate 20 and the lands 26 and fills the channel 24. A cavity region 30 overlies the first cladding layer 28. The cavity region 30 comprises a guide layer 32 overlying the first cladding layer 28 and an active layer 34 overlying the guide layer 32. A second cladding layer 36 overlies the cavity region 30 and a capping layer 38 overlies the second cladding layer 36. An electrically insulating layer 40 having an opening 42 extending therethrough over the channels 26 overlies the capping layer 38. An electrical contact 44 overlies the capping layer 38 in the region of the opening 42 in the electrically insulating layer 40. A second electrical contact 46 overlies the second major surface 22 of the substrate 18.

The alloys used for the particular layers of the array should be such that the refractive index of the active layer 34 is greater than the refractive index of the guide layer 32 which in turn is greater than the refractive index of the cladding layers 28 and 36. The laser array of the invention may be formed of materials such as GaAs and AlGaAs which have the requisite refractive index differences. Alternatively alloys of other Group III or V elements such as In, Ga, P, Sb and As may be used.

The substrate 18 and the first cladding layer 28 are of one conductivity type and the second cladding layer 36 and the capping layer 38 are of the opposite conductivity type. In the cavity region 30 the positions of the guide layer 32 and the active layer 34 are interchangeable. The guide layer 32 is preferably positioned between the first cladding layer 28 and the active layer 34 as shown in FIG. 1 and, in this case, has the same conductivity type as the first cladding layer 28. In some applications the guide layer 32 may be positioned between the active layer 34 and the second cladding layer 36 in which case the guide layer 32 has the same conductivity type as the second cladding layer 36. In other applications the guide layer 32 may not be present.

Figure 4:
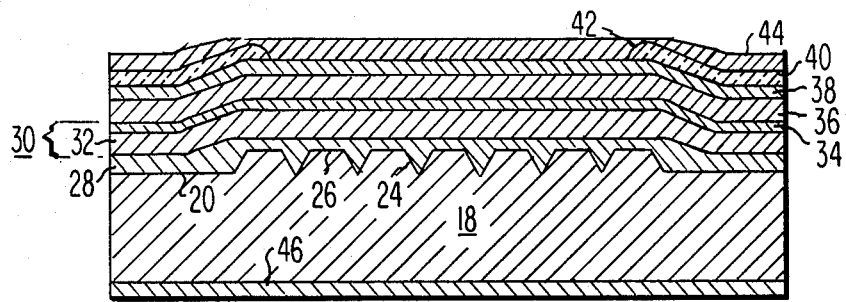

A laser array of the invention incorporates phase shifters 50 in alternate channels 24 as illustrated in FIG. 2. The phase shifters 50 comprise portions of the channels 24 which extend a distance into the substrate 18 less than the distance which the remainder of the channels 24 extend into the substrate. FIG. 3 is a cross-sectional view of the array 10 parallel to the direction of propagation of the laser beam which illustrates the phase shifters 50 in alternate channels of the array. The phase shifters extend a distance into the substrate less than the depth of the channels 24. FIG. 4 is a cross-section of the array 10 perpendicular to the direction of propagation of the laser beam illustrating a portion of the array where all the channels 24 have the same shape and depth and the phase shifters 50 are not present.

In the operation of the array 10 a bias voltage of the proper polarity is applied to the electrical contacts, producing lasing action over each channel in the cavity region. Light propagates in both the active and guide layers or in the active layer alone if the guide layer is not present with the evanescent tails of this radiation distribution extending into the cladding layers in the transverse direction. The lateral variation in the separation between the cavity region and the substrate over the channels produces a lateral variation in the transverse refractive index thereby forming a local index guide for light propagation over each channel. As noted previously, in most arrays gain considerations and the coupling between the lasing regions over each channel cause the adjacent regions to operate such that their relative phase difference is 180°. The phase shifters 50 provide a phase shift of the laser radiation over adjacent channels 24 relative to the phase of the laser radiation over the interlaced channels so that the emitted radiation from all the lasing regions is preferably in phase.

The phase shifters 50 are one or more portions of the alternate channels for which the lasing regions have a different transverse effective refractive index from that of the remainder of the channels. This difference in the refractive index arises from the difference in distance between the cavity region 24 and the surface of the phase shifters 50 and the surface of the remainder of the channels over the center of the channels. Since the substrate 18 is composed of a material having a different refractive index than that of the material comprising the adjacent cladding layer 28, the transverse refractive index for a laser beam propagating over a phase shifter 50 is different from the effective refractive index for the same beam propagating over a channel 24. The transverse refractive index can be calculated for a given configuration using techniques such as those disclosed by Botez in the IEEE Journal of Quantum Electronics QE 17, 178 (1982). The phase of the laser beam propagating over a phase shifter will be advanced/retarded relative to the laser beam propagating over the same portion of an adjacent channel depending upon the sign of the refractive index difference.

The change in phase of the beam after propagation over a phase shifter having length l along the propagation axis is $$\Delta\phi = 2\pi(n_s - n_c)l/\lambda_o$$

where $\lambda_o$ is the wavelength of the laser beam in air and $n_s$ and $n_c$ are the transverse effective refractive indices over the phase shifter 50 and the channel 24, respectively. The length, L, of the phase shifter required to produce a phase shift of 180° or an odd integral multiple j thereof is then:

$$L = (2j+1)\lambda_o/2(n_s - n_c).$$

Preferably the lengths of the phase shifters 50 of FIG. 1 are chosen to provide a phase shift of 180° corresponding to j=0. The length of the phase shifters 50 along the channel 24 and the depth of the phase shifters 50 below the surface of the lands 26 between the channels 24 are related to one another since the smaller the depth of the phase shifters 50 the greater the influence of the substrate and hence the greater the refractive index difference $(n_s - n_c)$ will be.

Figure 5:
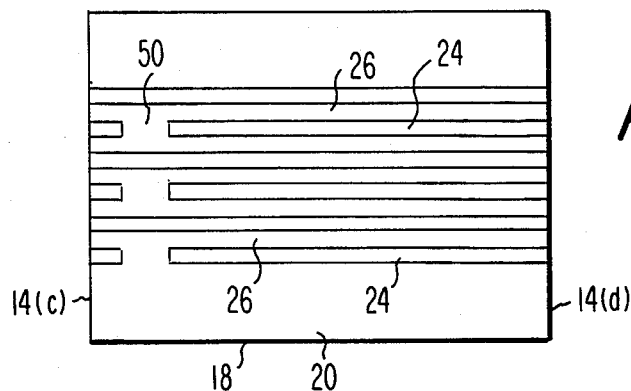
FIGS. 5, 6 and 7 are top views of the substrate surface with the channels therein showing different locations of the integral phase shifters of the invention.
Figure 6:
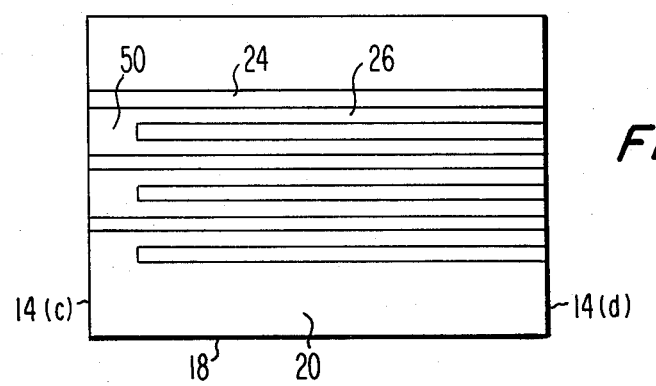
Figure 7:
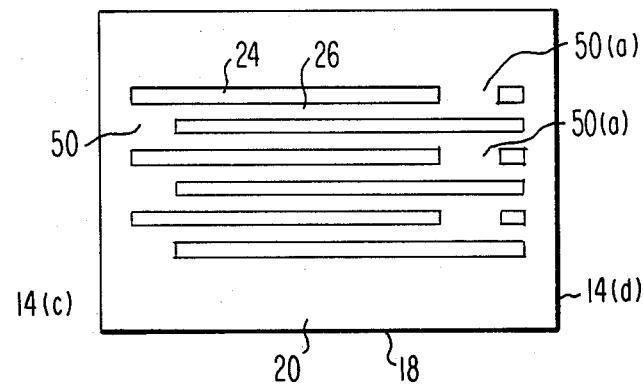

FIGS. 5–7 are top views of a substrate 18 prior to deposition of the overlying layers which illustrate several different arrangements of the channels 24 and the phase shifters 50. The sides of the substrate 18 are denoted as 14(c) and (d) to indicate those surfaces of the substrate which will be coincident with the reflecting surfaces 14(a) and (b), respectively, of the semiconductor body 12 of FIG. 1.

In the embodiment of FIG. 5 the phase shifters 50 are shown as breaks in the channels 24 spaced close to but a distance from the surface 14(c). In the embodiment of FIG. 6 the phase shifters 50 are shown as breaks in the channels 24 a distance from the surface 14(d) and as portions of the substrate extending from the opposed surface 14(c). FIG. 6 illustrates another principle of the invention that phase shifters 50 may be located at or near each surface with each phase shifter 50 producing a phase shift of sufficient magnitude, preferably 180°. FIG. 7 illustrates another principle of the invention that the channels 24 need not extend to the surfaces 14(c) and (d). It is sufficient that channels 24 have different lengths such that there exists a perturbation of the transverse effective refractive index in alternate channels which will produce a phase shift of sufficient magnitude relative to the phase of those laser beams propagating over the interlaced channels. Since the optical length of the cavity in the lasing regions having phase shifters 50 therein differs from that for the adjacent channels, it may be desirable to insert phase shifters 50(a) in the interlaced channels near the opposite surface, here surface 14(d), to make the optical lengths of the different lasing regions equal.

The phase shifters 50 are preferably positioned close to but a distance from the reflecting surface 14(a) through which light is emitted. This location minimizes the absorption of light at or near the surface and provides optimum gain and coupling between adjacent channels since the natural coupling with alternate beams being 180° out of phase is only perturbed over a short portion of the resonant cavity between the reflecting surfaces. However, the laser beams emitted by the different lasing regions into the ambient are in phase and will produce a far-field radiation pattern having a single lobe.

While the principles of the invention have been described with relation to the laser array 10 of FIG. 1, it is to be understood that these principles are equally applicable to any laser array wherein the lasing regions are centered over channels in the substrate or one of the overlying layers.

A laser array embodying the principles of the invention may be fabricated using well-known photolithographic masking and etching techniques to form the channels followed by standard liquid-phase epitaxy techniques to deposit the layers over the surface containing the channels. Etching techniques to form the channels may include selective chemical etching of a surface having a particular crystallographic orientation or ion etching using techniques well known in the art. Suitable liquidphase epitaxy techniques have been disclosed by Lockwood et al. in U.S. Pat. No. 3,753,801, Botez in U.S. Pat. No. 4,347,486, both of which are incorporated herein by reference, and by Botez et al. in U.S. Pat. No. 4,547,396. In particular the laser array 10 of FIG. 1 may be fabricated using the liquidepitaxy techniques disclosed by Botez et al.

The substrate 18 is preferably composed of N-type GaAs having a first major surface 20 which is parallel to or slightly misoriented from the (100) crystallographic plane. The channels 24 are preferably uniformly spaced and are typically between about 1.5 and 2.5 micrometers ($\mu$m) deep, having a width at the surface 20 between about 3 and 4 $\mu$m with a typical center-to-center spacing between about 4 and 6 $\mu$m. Larger center-to-center spacings may also be useful in which case the other dimensions change accordingly. The channels 24 are typically vee-shaped with planar surface lands 26 therebetween but may have another shape. It is to be understood that the substrate 18 is also meant to include an epitaxial layer on the surface 20 in which the channels 24 are formed.

The first cladding layer 28 is typically composed of N-type $Al_rGa_{1-r}As$ where r is between about 0.20 and 0.45 and preferably between about 0.25 and 0.35. This layer is comparatively thin over the lands between the channels 24, being between about 0.1 and 0.4 $\mu$m and typically producing a planar layer surface of the first cladding layer 28 upon which the succeeding layers are deposited. Alternatively the deposition of the first cladding layer 28 is controlled so that the channels 24 are not filled thereby producing a curved surface of the first cladding layer 28.

The guide layer 32 is typically composed of N-type $Al_xGa_{1-x}As$ where x is between about 0.15 and 0.30 and preferably between about 0.18 and 0.25. This layer is typically planar and is between about 0.3 and 0.6 $\mu$m thick and preferably about 0.4 $\mu$m thick. If the layer is non-planar, it is typically between about 0.3 and 0.6 $\mu$m thick over the channels and between about 0.1 and 0.4 $\mu$m thick over the lands between the channels.

The active layer 34 is typically composed on $Al_yGa_{1-y}As$ where y is between about 0.0 and 0.15, and preferably between about 0.03 and 0.12 and is preferably undoped. If the active layer 34 is planar, it is typically between about 0.05 and 0.12 $\mu$m thick. If it is formed on a curved surface, it is typically between about 0.05 and 0.12 $\mu$m thick over the channels and thinner but nonzero over the planar lands 26 between the channels 24.

The second cladding layer 36 is typically between about 0.18 and 1.5 $\mu$m thick and is composed of P-type $Al_zGa_{1-z}As$ where z is between about 0.25 and 0.45, and preferably between about 0.28 and 0.35.

The capping layer 38 is typically between about 0.5 and 1.0 $\mu$m thick and is composed of P-type GaAs and is used to facilitate ohmic electrical contact between the underlying semiconductor material and the overlying metal contact.

The electrically insulating layer 40 is preferably composed of silicon dioxide which is deposited on the capping layer 38 by pyrolytic decomposition of a silicon-containing gas, such as silane, in oxygen or water vapor. An opening 40 is formed through the electrically insulating layer down to the capping layer 38 over the channels 24 using standard photolithographic masking techniques and etching processes. The broad area electrical contact 44 is then deposited over the capping layer 38 where it is exposed to the opening 42. The broad area electrical contact 44 is preferably composed of sequentially evaporated titanium, platinum, and gold. A substrate electrical contact 46 is deposited on the major surface 22 of the substrate 18 by sequential evaporation of germanium, gold, nickel and gold, followed by a sintering step.

The reflecting surface 14(a) of the array is typically coated with a layer of $Al_2O_3$ or a similar material having an optical thickness of about one-half wave at the lasing wavelength as disclosed by Ladany et al. in U.S. Pat. No. 4,178,564 or a coating having an optical thickness of one-quarter wave. The reflecting surface 14(b) is coated with a reflector consisting of an electrical insulator such as $SiO_2$ coated with a layer of gold as disclosed by Caplan et al. in U.S. Pat. No. 3,701,047. Alternatively the mirror may be a multi-layer reflector such as that disclosed by Ettenberg in U.S. Pat. No. 4,092,659. All three of these patents are incorporated herein by reference.

The phase shifters 50 are typically formed in the same step as the channels if the surface of the phase shifters are chosen coincident with the surface of the lands 26. Alternatively the phase shifters 50 may be formed using separate masking and etching steps if the surface of the phase shifters 50 is chosen to be different from that of the surface of the lands 26.

Typically the spacing between the reflecting surfaces 14(a) and (b) is between about 250 and 300 $\mu$m. The length of the phase shifter 50 depends upon the difference in the transverse effective refractive index over the channel 24 and the phase shifter 50 which in turn depends upon a number of factors including the location of the surface of the phase shifters relative to the active layer, the materials used for the different layers and the transverse spatial extent of the propagating modes. Typically the length of the phase shifters 50 along the direction of propagation is between about 20 and 150 $\mu$m. Preferably their length should be kept as short as possible to minimize the effect of their presence on the gain and coupling between adjacent lasing regions.

I claim:

1. A phase-locked semiconductor laser array comprising
    a body of semiconductor material having first and second reflecting surfaces with at least said first reflecting surface being partially transparent at the laser wavelength so that light may be emitted therefrom; said body including:

a substrate with a pair of opposed major surfaces with a plurality of substantially parallel channels with lands therebetween in the first major surface and extending between the reflecting surfaces;

a first cladding layer overlying the first major surface of the substrate and the channels;

a laser cavity region overlying the first cladding layer;

a second cladding layer overlying the laser cavity region; and first and second electrical contacts to the second cladding layer and the second major surface of the substrate respectively;

wherein each channel is spaced from adjacent channels by a distance such that the laser oscillations over adjacent channels are phase-locked to one another; and alternate channels having means for shifting the phase of laser beams propagating in the cavity region over said alternate channels relative to the phase of laser beams propagating over the adjacent channels.

2. The array of claim 1 wherein said phase-shifting means comprise portions of said alternate channels having a different spacing from the cavity region than the remainder of said alternate channels.

3. The array of claim 2 wherein said phase-shifting means comprise a first portion of each of said alternate channels which extends a distance into the substrate less than the distance which the remainder of said alternate channels extend into the substrate.

4. The array of claim 3 wherein said first portions have a surface which is co-planar with the surface of said lands.

5. The array of claim 3 wherein said first portions are positioned close to but a distance from said partially transparent reflecting surface.

6. The array of claim 5 wherein the channels adjacent to said alternate channels have second phase-shifting means positioned close to but a distance from said second reflecting surface.

7. The array of claim 2 wherein said phase-shifting means produce a phase shift of said laser beam of about 180°.

8. The array of claim 7 wherein the cavity region comprises a guide layer overlying the first cladding layer and an active layer overlying the guide layer.

9. The array of claim 8 wherein the length of the first portions is between about 20 and 150 $\mu$m.

* * * * *